(12) United States Patent
Zhao et al.

(10) Patent No.: US 8,143,166 B2
(45) Date of Patent: Mar. 27, 2012

(54) POLISHING METHOD WITH INERT GAS INJECTION

(75) Inventors: Feng Zhao, Singapore (SG); Wu Ping Liu, Singapore (SG); John Sudijono, Singapore (SG); Laertis Economikos, Falls, NY (US); Lawrence A. Clevenger, LaGrangeville, NY (US)

(73) Assignee: GlobalFoundries Singapore Pte. Ltd., Woodlands (SG)

( * ) Notice: Subject to any disclaimer, the term of this patent is extended or adjusted under 35 U.S.C. 154(b) by 751 days.

(21) Appl. No.: 12/046,151

(22) Filed: Mar. 11, 2008

(65) Prior Publication Data
US 2009/0233444 A1 Sep. 17, 2009

(51) Int. Cl.
*H01L 21/461* (2006.01)
(52) U.S. Cl. .......................................... 438/692; 451/28
(58) Field of Classification Search .................. None
See application file for complete search history.

(56) References Cited

U.S. PATENT DOCUMENTS

| | | | |
|---|---|---|---|
| 5,649,855 A | 7/1997 | Chikaki | |
| 6,117,783 A * | 9/2000 | Small et al. | 438/693 |
| 6,705,928 B1 * | 3/2004 | Barns | 451/60 |
| 6,951,597 B2 * | 10/2005 | Korovin | 156/345.13 |
| 7,059,948 B2 | 6/2006 | Li et al. | |
| 7,160,176 B2 | 1/2007 | Lee et al. | |
| 2003/0171239 A1* | 9/2003 | Patel et al. | 510/406 |
| 2006/0121725 A1* | 6/2006 | Basol et al. | 438/626 |

FOREIGN PATENT DOCUMENTS
WO WO2006022452 * 3/2006

OTHER PUBLICATIONS

C. Gray, D. Apone, et. al., Viewing Asperity Behavior Under the Wafer During Chemical Mechanical Polishing, [online], Publish Internet Date Nov. 8, 2005, [retrieved on Dec. 2010], Retrieved from http://www.tuftl.tufts.edu/cmpwebsite2/public/bibliography/tufts.htm.*

* cited by examiner

*Primary Examiner* — Binh X Tran
*Assistant Examiner* — David Cathey, Jr.
(74) *Attorney, Agent, or Firm* — Brinks Hofer Gilson & Lione (57) ABSTRACT

A polishing process in a semiconductor device fabrication process employs a polishing composition in which a gaseous phase is created within the polishing composition. During a polishing process, the gaseous phase dynamically responds to changes in the surface profile of the material undergoing removal by chemical and abrasive action during polishing. The inert gas bubble density dynamically increases in proximity to surface region of the substrate being polished that are prone to dishing and erosion. The increased inert gas bubble density operates to reduce the polish removal rate relative to other regions of the substrate. The dynamic action of the gaseous phase within the polishing composition functions to selectively reduce the localized polish removal rate such that a uniformly smooth and flat polished surface is obtained that is independent of the influence of pattern density during the polishing process.

23 Claims, 6 Drawing Sheets

POLISHING METHOD WITH INERT GAS INJECTION

TECHNICAL FIELD

This invention relates, generally, to methods for fabricating semiconductor devices and, more particularly, to methods for chemical-mechanical-polishing semiconductor substrate.

BACKGROUND

In order to build faster and more complex integrated circuits, semiconductor manufacturers have increased the number of components in the integrated circuit while reducing the overall size of the circuit. The small circuit size requires multiple overlying metal layers to electrically interconnect the vast number of components within the integrated circuit. As successive layers of conductors and dielectric materials are deposited over previously defined structures, the surface topography can become uneven. Also, advanced circuits incorporate embedded conductive metal leads formed in inlay patterns within an insulating layer. The pattern density can vary widely across different regions of the circuit.

To be manufactured reliably, the metal layers need to be deposited, and an interconnect pattern defined on a smooth, planar surface. A planarization process is typically performed after the deposition of an insulating layer to reduce the topographic contrast of the insulating layer. A conductive layer is then deposited on a smooth, even surface and the interconnect pattern reliably defined using conventional photolithography. In a process to form an inlaid metal layer, an inlay pattern is formed in the insulating layer and a metal is deposited over the insulating layer. The metal layer and the insulating layer are subjected to a planarization process to produce a smooth surface.

One method for planarizing the substrate surface during integrated circuit fabrication is a polish planarization process. Chemical-mechanical-polishing (CMP) processes have been developed which abrasively removed elevated portions of both insulating materials and metals. In this process, the surface of the substrate is brought into contact with a polish pad covered with liquid polishing slurry. A portion of the insulating or metal layer is then removed by the mechanical action of the polish pad and the chemical action of the slurry.

A common requirement of all polishing processes is that the substrate be uniformly polished. Uniform polishing can be difficult because, typically, there is a strong dependence in the polish removal rate with localized variations in the surface topography of the substrate. For example, in substrate areas having a high degree of surface variation, such as areas having closely spaced adjacent trenches, the polishing rate is higher than in areas lacking a high degree of surface contrast, such as areas having large active device regions. The variation in polish removal rate caused by feature density variation results polishing process effects know as dishing and erosion. To avoid the effects of dishing and erosion, the polishing time can be extended beyond that required to just remove the metal or insulating layer from the most elevated regions. The polish time cannot be extended indefinitely, however, or layers underlying the insulating layer can be damaged.

While potentially offering wide versatility and a high degree of uniformity, the polish process must be controlled to avoid generating an uneven surface and damaging underlying layers. This problem has been made more difficult by the recent development of abrasive-free polishing slurries. Accordingly, a need exists for an improved polishing process that is less sensitive to feature density variations across device circuits and supporting substrates.

BRIEF SUMMARY

In one embodiment, a polishing process includes providing a substrate having an uneven surface. The uneven surface is characterized by high regions and low regions with respect to a principal surface. An inert gas is introduced into a polishing slurry distributed on a polishing pad. The uneven surface is contacted with the polishing slurry and polished. A gaseous phase forms in regions of the polishing slurry in contact with the low regions of the uneven surface. The gaseous phase retards a localized polishing rate in the low regions with respect to a localized polish rate in the high regions.

In another embodiment, a method for polishing a substrate includes forming a polishing composition on a polishing surface. An inert gas is introduced into the polishing composition. An uneven surface having low regions is contacted with the polishing composition. The uneven surfaces polished and a gaseous phase is selectively formed in regions of the polishing composition that are in spaced relationship to the low regions of the uneven surface.

In yet another embodiment, a method for forming a polishing composition includes providing a polishing liquid and introducing an inert gas into the polishing liquid to form a bubble layer at the surface of the polishing liquid. An uneven surface is contacted with the bubble layer, where the bubble concentration in the bubble layer varies in relation to the features in the uneven surface.

DETAILED DESCRIPTION

Figure 1:
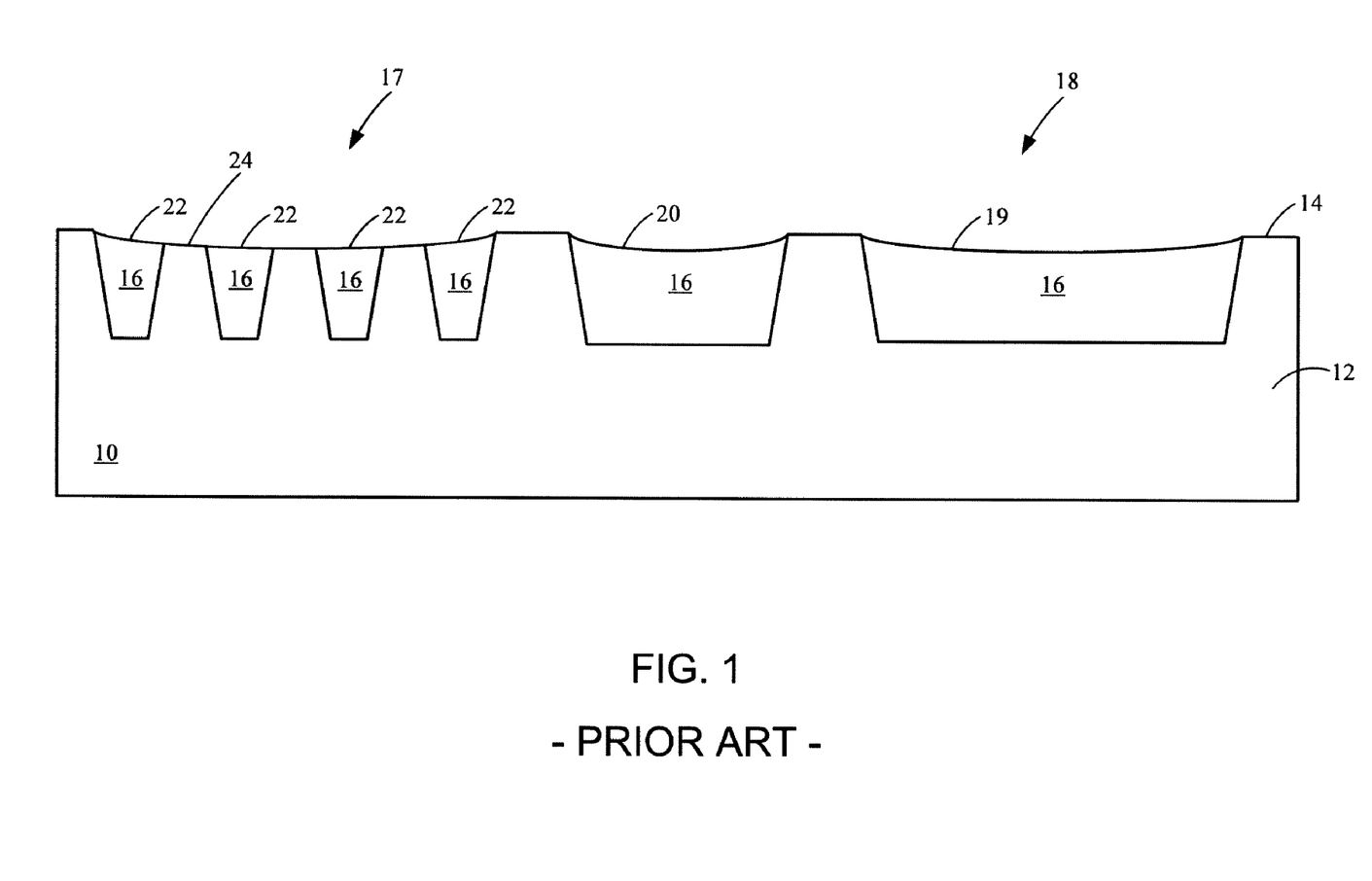
FIG. 1 illustrates, in cross-section, a substrate having inlaid copper features and having a surface profile created by a polishing process of the prior art.

Shown in FIG. 1, in cross-section, is a substrate 10 having been polished by a prior art polishing process. Substrate 10 includes an inlay pattern formed in a dielectric layer 12. The inlay pattern is formed by etching recessed features into insulating layer 12 using a lithographic masking and etching process. Metal interconnects are formed in insulating layer 12 by depositing a metal layer onto substrate 10 that fills the recessed regions in insulating 12 and overlies remaining portions of the substrate 10. In accordance with the prior art, a CMP process is carried out to remove portions of the metal layer from a principal surface 14 of insulating layer 12. Upon completion of the CMP process, metal regions 16 remain in the recesses in insulating layer 12.

As shown in FIG. 1, the CMP process of the prior art forms an uneven upper surface across substrate 10. In particular, relative to principal surface 14, the surface profile varies in relation to the overall dimensions and spatial separation or density of the recesses in insulating layer 12. The uneven surface is characteristic of CMP processes carried out in accordance with the prior art in that the surface profile shows the effects of dishing and erosion.

The inlaid metal pattern within insulating 12 includes a high pattern density region 17 and a low pattern density region 18. With respect to principal surface 14, metal surfaces 19 and 20 in region 18 reside below the principal surface 14. This phenomenon is known as dishing. Further, both metal surfaces 22 and insulating layer surface 24 in region 17 reside below principal surface 14. This phenomenon is known as erosion. Notably, the erosion typically occurs in regions of substrate 10 having a relatively high density pattern, such as region 17, while the dishing phenomenon typically occurs in regions of substrate 10, such as region 18, having a relatively low density pattern.

The overall polished surface profile obtained by the CMP process carried out in accordance with the prior art is characteristic of CMP processes used to form copper damascene features during semiconductor device fabrication. The inlaid copper forms electrical leads and interconnections to various components in the integrated circuit under fabrication. The uneven polished surface created by the CMP process of the prior art will continue to be propagated as subsequent layers of material are deposited over the inlaid metal pattern within insulated layer 12. As subsequent layers are deposited on substrate 10, the uneven surface profile will be propagated and compounded. The increased surface irregularity can increase step sizes and create opens or voids overlying metal features, such as additional metal interconnects, electrical contacts, and the like.

Figure 2:
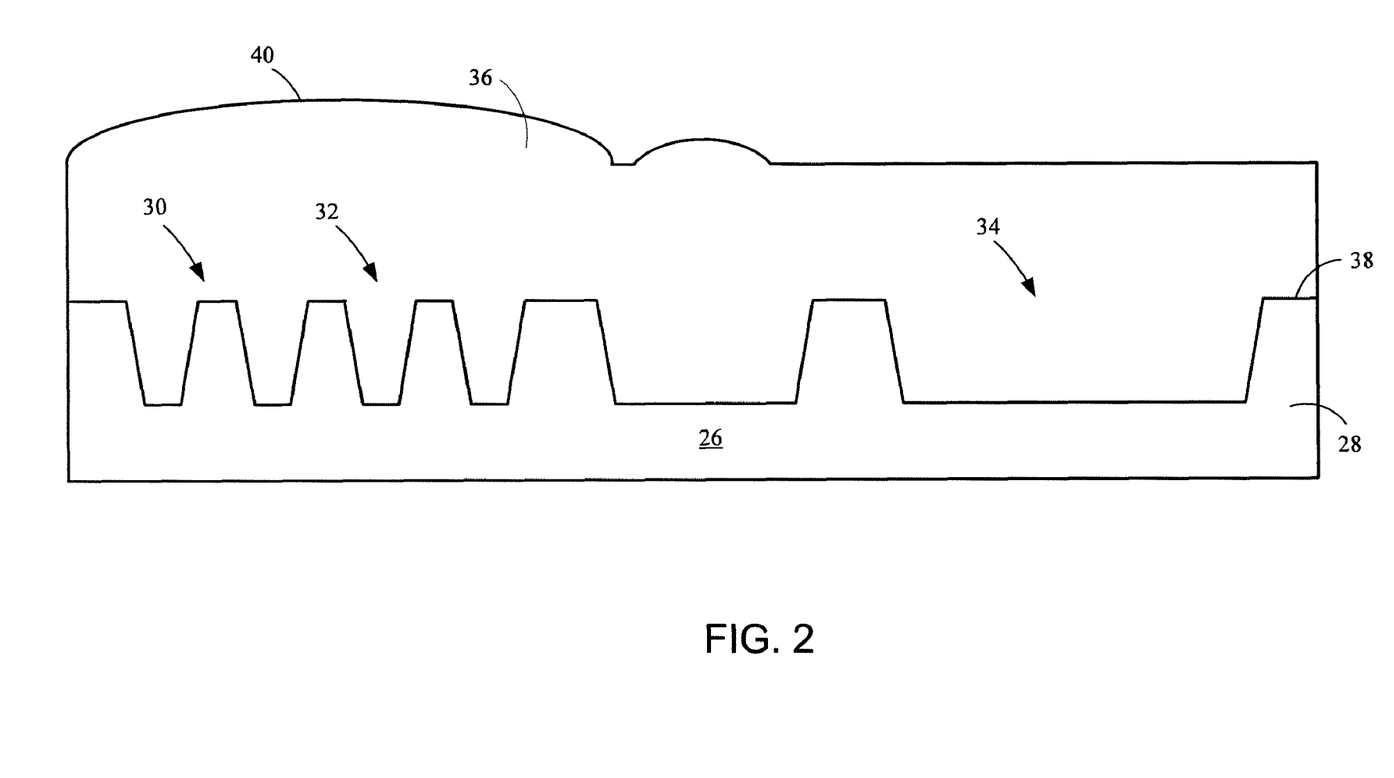
FIG. 2 illustrates, in cross-section, an inverted view of a substrate having a copper layer deposited thereon and in position to be polished by a polishing process in accordance with an embodiment of the invention.

FIG. 2 illustrates a substrate 26 in preparation for undergoing a polishing process in accordance with an embodiment of the invention. In similarity with the substrate shown in FIG. 1, an insulating layer 28 overlies substrate 26 and includes recesses 30 formed in the insulating layer. Recesses 30 are more numerous in high-density region 32 than in low-density region 34.

A fill layer 36 is deposited onto substrate 26 and fills recesses 30. Fill layer 36 can be one of a number of different types of metal, such as tungsten, copper, aluminum, aluminum alloys, and the like. Further, although the recessed features, such as recesses 30 are typically filled with a metal, other materials can also be deposited on substrate 26. For example, fill layer 36 can be an insulating material, such as silicon oxide, silicon nitride, a low-K or low-K dielectric material, and the like. In one embodiment, fill layer 36 is a copper metal that has been electro-deposited onto substrate 26. The electro-deposition process forms a thick layer of copper metal that fills recesses 30 and piles up on principal surface 38 of insulating layer 28.

As illustrated in FIG. 2, fill layer 36 has an uneven upper surface 40. The contour of upper surface 40 is somewhat reflective of the pattern density of recesses 30 in insulating layer 28. For example, during the electro-deposition process, copper metal fills the recesses in high-density region 32, then continues to pile up to a relatively large thickness over these recesses. Other surface irregularities, such as troughs (not shown), can also be created in the profile of upper surface 40. The surface irregularities formed in spaced relationship to the variations in pattern density of recesses 30.

After depositing fill layer 36 onto substrate 26, a polishing process is performed to remove regions of fill layer 36 above principal surface 38 of substrate 26. The goal of the polishing process is to remove excess film material and form a uniformly smooth and relatively flat upper surface. Further, it is important that the polishing process preferentially remove the fill material, while not substantially removing portions of insulating layer 28. Such a selective polishing process will avoid the dishing and erosion problems described above.

Figure 3:
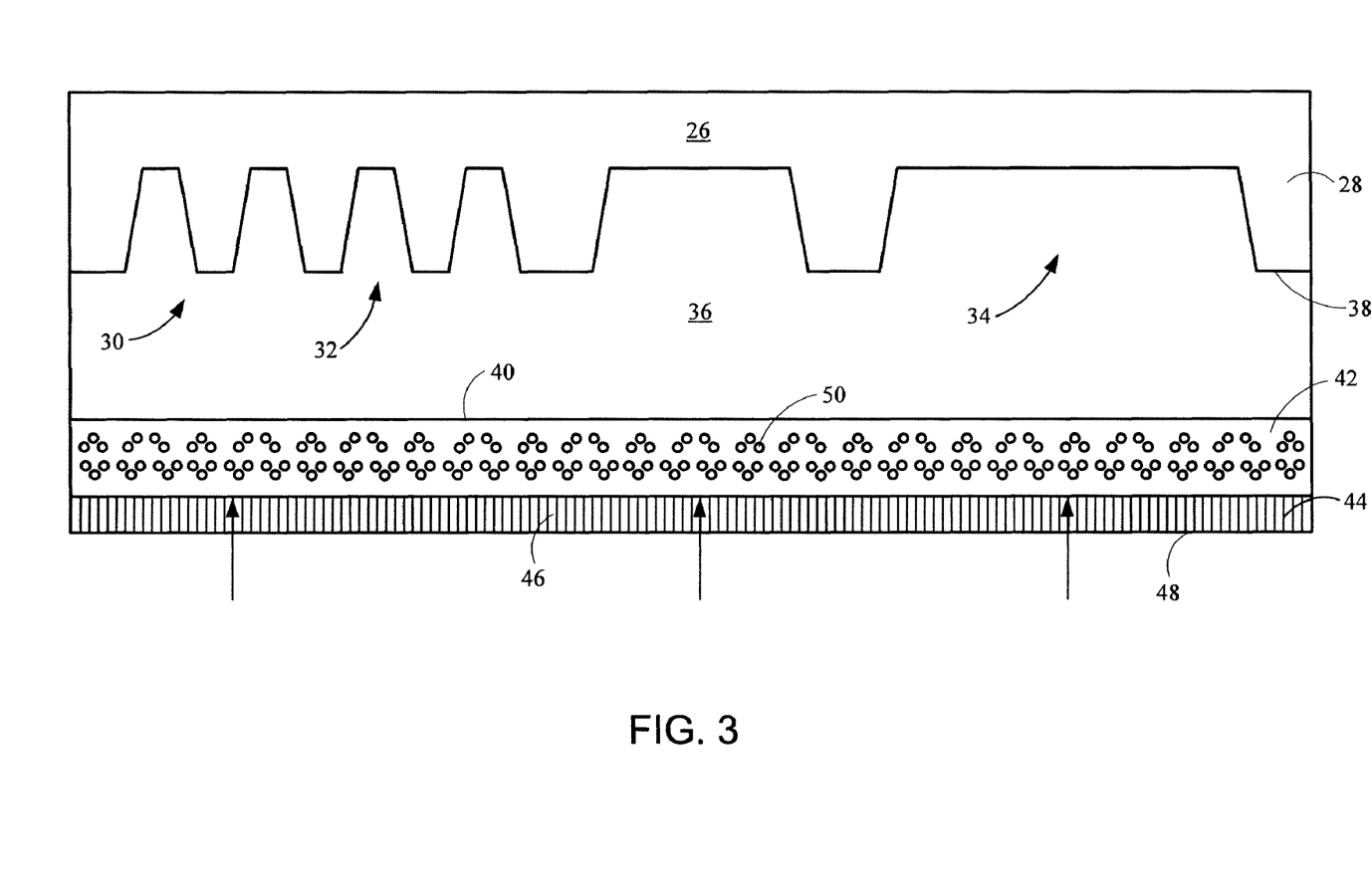
FIG. 3 illustrates, in cross-section, a polishing composition in contact with the substrate of FIG. 2 during the initial phases of a polishing process in accordance with an embodiment of the invention.

Referring to FIG. 3, a polishing process in accordance with an embodiment of the invention is initiated to begin removing fill layer 36. In FIG. 3, substrate 26 has been inverted with respect to the orientation shown in FIG. 2. Further, fill layer 36 is in contact with a liquid polishing composition 42 that is distributed on a polishing pad 44. In the polishing process, polishing pad 44 is moved relative to substrate 26 while applying compressive pressure to one or both of polishing pad 44 and substrate 26. Polishing composition 42 occupies the interface region between polishing pad 44 and upper surface 40 of fill layer 36.

During the initial stages of the polishing process, polishing composition 42 only contacts fill layer 36 and the upper portions of fill layer 36 are removed by a combination of chemical reaction and abrasion created by the relative movement of polishing pad 44 and substrate 26. Because of the thickness of fill layer 36, during the initial stages of the polishing process, fill material is uniformly removed and upper surface 40 of fill layer 36 becomes relatively flat. As will subsequently be described, the inventive polishing process operates to maintain the relative flat profile of upper surface 40 throughout the polishing process.

In accordance with one aspect of the invention, an inert gas is introduced into polishing composition 42. The inert gas can be any gaseous species that will not react with the components of polishing composition 42 or the material of fill layer 36. Any of a variety of inert gases can be used depending on the particular type of polishing composition of fill layer 36 and insulating layer 28. For example, the inert gas can be a noble gas, such as helium, neon, argon, krypton, and the like. Further, the inert gas can be nitrogen or a molecular gas containing carbon and oxygen, such as carbon monoxide, carbon dioxide, and the like.

In one embodiment of the invention, the inert gas is injected (indicated by the arrows) into polishing composition 42 through pores 46 in polishing pad 44. For example, a gas-handling system can be included in the CMP polishing apparatus that delivers inert gas to the backside 48 of pad 44 and disperses the gas along the backside 48. Alternatively, the inert gas can be injected through gas nozzles positioned at various locations in or near polishing composition 42. Such a configuration can allow for a combination of inert gas injection by means of independent gas nozzles (not shown) in combination with gas injection through pores of the polishing pad.

In one embodiment, pad 44 is a conventional porous polishing pad having holes or pores present on the pad surface for dispensing polishing liquids therethrough. In the inventive process, inert gases, instead of polishing liquid, is injected through the pores of the conventional polishing pad. Polishing composition 42 is distributed on the polishing pad through another method, such as a dispensing tube, or the like, situated in proximity to the polishing pad. Those skilled in the art will appreciate that porous polishing pads are commercially available from vendors such as Rohm & Haas and Rodel, and others. In an alternative embodiment, a polishing pad that is specially designed to provide gas injection can be provided.

The inert gas forms a gaseous phase 50 within polishing composition 42. During the initial stages of the polishing process, gaseous phase 50 is substantially uniformly distributed within polishing composition 42.

Figure 4:
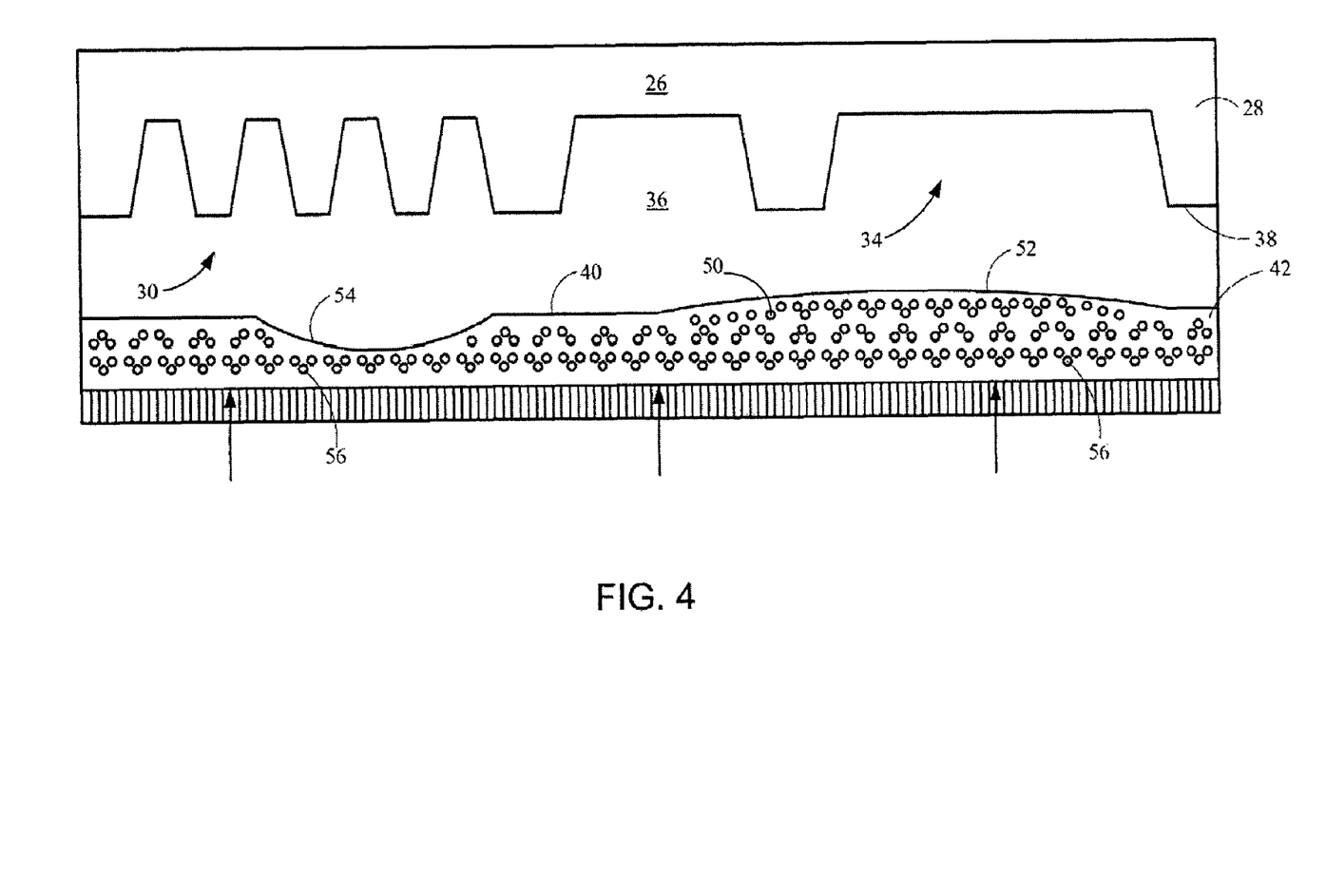
FIG. 4 illustrates, in cross-section, a polishing composition in contact with the substrate of FIGS. 2 and 3 during an intermediate phase of the polishing process in accordance with an embodiment of the invention.

The polishing process continues through an intermediate stage illustrated in FIG. 4. In the intermediate stage, the differences in the pattern density of recesses 30 begins to influence the polishing process. As removal of fill layer 36 continues, upper surface 40 draws closer to substrate 26. The pattern density effects of recesses 30 cause upper surface 40 to become uneven. In accordance with an aspect of the invention, the gaseous phase within polishing composition 42 dynamically responds to the changes in the contour of upper surface 40. Because of the hydrodynamic action of gaseous phase 50 during the inventive polishing process, the distribution of inert gas in polishing composition 42 changes in response to the changes in profile of upper surface 40.

As illustrate in FIG. 4, the distribution density of inert gas in polished composition 42 is greater in proximity to low surface region 52 as compared to high surface region 54. The distribution of inert gas in polishing composition 42 is characterized by the formation of inert gas bubbles 56 within polishing composition 42. The dynamic response of gaseous phase 50 is reflected by the greater density of gas bubbles 56 in proximity to low region 52 as compared to the lower density of bubbles 56 in proximity to high region 54.

The dynamic response of gaseous phase 50 during the polishing process functions to reduce the localized polishing rate of the fill material in low region 52 relative to the localized polishing rate in high region 54. By slowing down the polish removal rate in region 52, while maintaining a relatively high polishing rate in region 54, variations in the contour of upper surface 40 are dynamically addressed by the concentration density of gas bubbles within polishing composition 42. The greater density of gas bubbles 56 in proximity to low region 52 functions to reduce the chemical reaction and abrasive action of the polishing process in region 52. Correspondingly, the density of inert gas bubbles 56 in proximity to region 54 is relatively low, such that the chemical reactive and abrasive action taking place in high region 54 is maintained.

Figure 5:
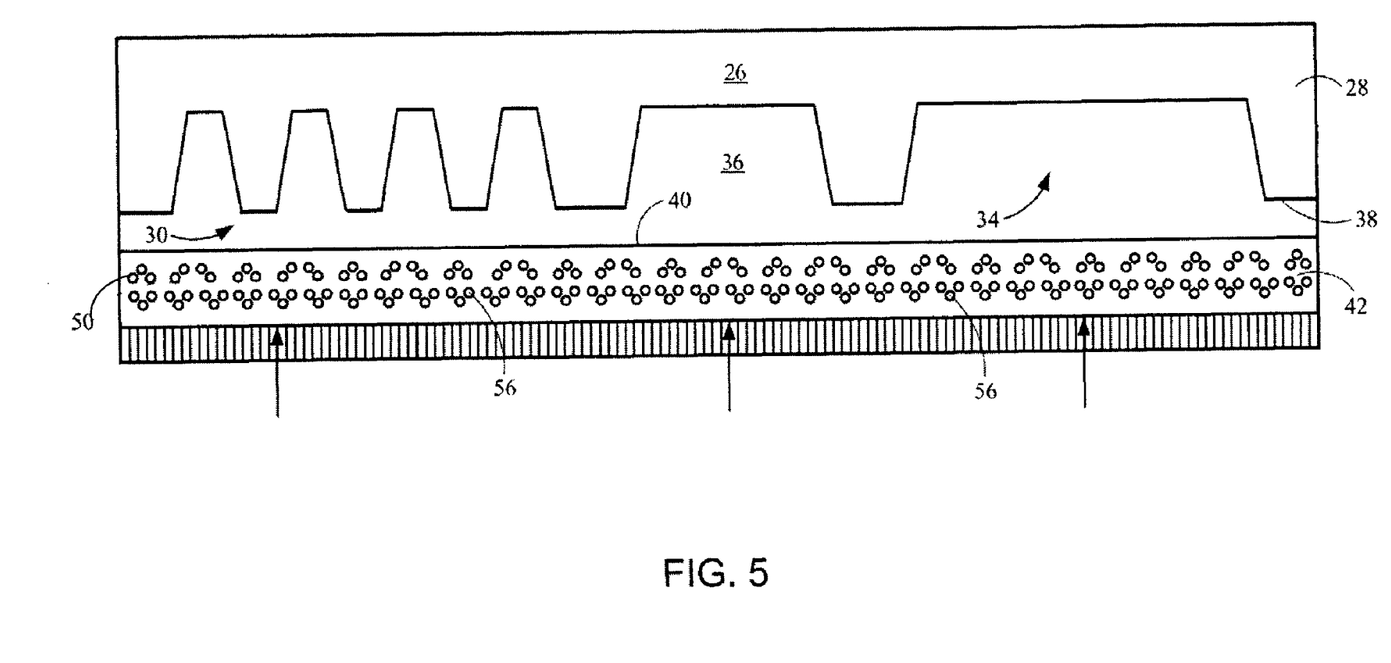
FIG. 5 illustrates a polishing composition in contact with substrate illustrated in FIGS. 2-4 during a later phase of the polishing process in accordance with an embodiment of the invention.

An advanced stage of the inventive polishing process is illustrated in FIG. 5. The dynamic gaseous phase within the polishing composition 42 has compensated for the irregular surface profile during the intermediate process stage and has returned upper surface 40 to a relatively flat profile. Once the contour irregularities are removed, gaseous phase 50 within polishing composition 42 once again becomes uniformly distributed throughout polishing composition 42. Inert gas bubbles 56 remain active, however, in polishing composition 42 and will instantaneously respond to further surface irregularities during the final stages of the polishing process. Importantly, the low regions and high regions that previously developed in upper surface 40 under the influences of pattern density differences recesses 30 have been removed. Accordingly, the inventive polishing process continues to uniformly remove fill layer 36 as upper surface 40 approaches principal surface 38 of insulating layer 28.

Figure 6:
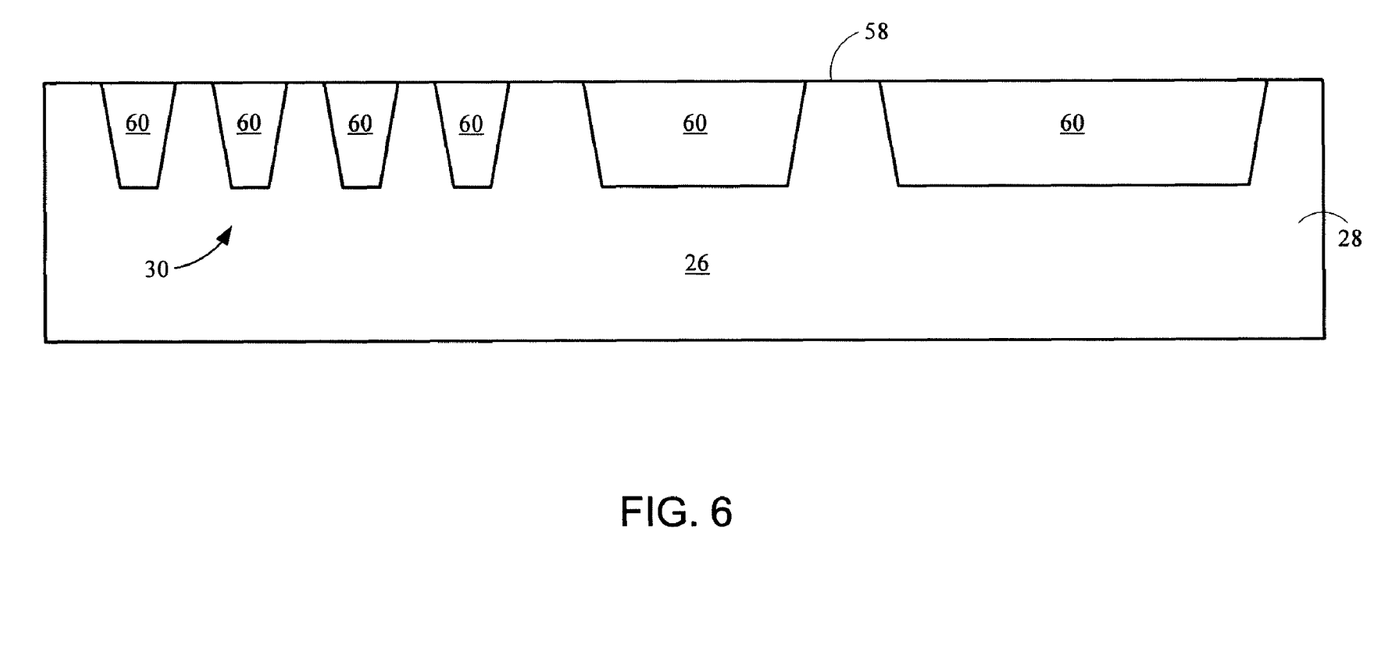
FIG. 6 illustrates the substrate of FIGS. 2-5 upon completion of the polishing process carried out in accordance with the illustrative embodiment.

As illustrated in FIG. 6, upon completion of the inventive polishing process, substrate 26 has a uniformly polished surface 58. In FIG. 6, substrate 26 has been returned to its upright position and is positioned in the same orientation as illustrated in FIG. 2. The inventive polishing process has uniformly removed fill layer 36, while not substantially removing portions of insulating layer 28. Accordingly, upper surface 58 is uniformly flat across all regions of substrate 26. Fill material occupies recesses 30 in substrate 26 and forms an inlaid pattern 60 in substrate 26. Importantly, upper surface 58 does not exhibit artifacts of the polishing process, such as erosion or dishing.

Following the polish removal of fill layer 36, the substrate is washed with deionized water and, in the case where fill layer 36 is copper, a passivation step is carried out. The passivation step reduces corrosion of the copper inlaid pattern. In accordance with an aspect of the invention, inert gas can be continuously introduced into the cleaning and passivation solutions. The gaseous phase functions to enhance the cleaning action of the deionized water and to uniformly distribute the passivation agent on the substrate.

Those skilled in the art will appreciate that a wide variety of polishing compositions are available for use in a CMP process. All such polishing compositions are potentially available for use in the inventive polishing process described here. Further, those skilled in the art will appreciate that a wide variety of polishing pad materials and compositional configurations are widely available for use in various types of commercially available polishing equipment. Further, those skilled in the art will recognize that polishing systems having various polish pad and platen configurations are commercially available and can be employed to carry out the inventive polishing process.

Those skilled in the art will further appreciate that the substrate illustrated in FIG. 6 can be further processed using a variety of known semiconductor processing techniques to form a wide variety of semiconductor devices. The polishing process illustrated in FIGS. 2-6 represents a polish planarization process that can be used at various stages in a semiconductor fabrication process to form a relatively smooth and flat surface upon which subsequent layers can be deposited to complete the fabrication of a semiconductor device. For example, semiconductor devices having multiple layers of metal interconnects can be formed using the inventive process described herein.

Thus, it is apparent that there has been described, in accordance with an illustrative embodiment of the invention a polishing process with inert gas injection that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, various pore configurations can be employed in a polishing pad that allow for variations in gas permeation through the polishing pad. Further, various polishing materials can be selected depending upon the particular type of inert gas being injected through the polishing pad. It is therefore intended to include within the invention all such variations and modifications as fall within the scope of the appended claims and equivalence thereof.

The invention claimed is:
1. A polishing process comprising:
providing a substrate having an uneven surface characterized by high regions and low regions with respect to a principal surface;
distributing a polishing slurry onto a porous polishing pad;
contacting the uneven surface with the polishing slurry and polishing the uneven surface; and
injecting a slurry-free inert gas through the porous polishing pad and into the polishing slurry distributed on the porous polishing pad before or during polishing, such that a gaseous phase forms in regions of the polishing slurry in contact with the low regions of the uneven surface, wherein the gaseous phase retards a localized polish rate in the low regions with respect to a localized polish rate in the high regions.

2. The method of claim 1, wherein injecting a slurry-free inert gas comprises introducing a noble gas.

3. The method of claim 1, wherein injecting a slurry-free inert gas into comprises introducing a nitrogen gas.

4. The method of claim 1, wherein injecting a slurry-free inert gas comprises introducing a molecular gas containing carbon and oxygen.

5. The method of claim 1, wherein injecting a slurry-free inert gas through the porous polishing pad comprises injecting through holes in the porous polishing pad.

6. The method of claim 1 further comprising flushing the substrate with deionized water.

7. The method of claim 1, wherein injecting a slurry-free inert gas into the polishing slurry comprises introducing the inert gas during polishing the uneven surface.

8. The method of claim 1, wherein providing a substrate having an uneven surface comprises:

forming an insulating layer on the substrate, the insulating layer including an inlay pattern therein, the inlay pattern having areas of high feature density and areas of low feature density; and forming a metal layer on the insulating layer, wherein the low regions of the uneven surface overlie areas of low feature density and the high regions of the uneven surface overlie areas of high feature density.

9. The method of claim 8, wherein forming a metal layer on the insulating layer comprises forming a copper or copper-containing layer on an insulating layer.

10. The method of claim 1, wherein providing a substrate having an uneven surface comprises forming an insulating layer on the substrate, and wherein polishing the uneven surface comprises polishing the insulating layer.

11. The method of claim 1, wherein the polishing process comprises a process carried out in the fabrication of a semiconductor device.

12. A method for polishing a substrate, the method comprising:

dispensing a polishing composition onto a surface of a porous polishing surface;

injecting a slurry-free inert gas into the polishing composition through the porous polishing surface;

contacting an uneven surface with the polishing composition, the uneven surface having low regions;

polishing the uneven surface; and selectively forming a gaseous phase in regions of the polishing composition in spaced relationship to the low regions of the uneven surface.

13. The method of claim 12, wherein the gaseous phase retards a localized polish rate in the low regions with respect to the remainder of the uneven surface.

14. The method of claim 12, wherein injecting a slurry-free inert gas into a polishing slurry comprises introducing a noble gas.

15. The method of claim 12, wherein injecting a slurry-free inert gas into a polishing slurry comprises injecting a nitrogen gas.

16. The method of claim 12, wherein injecting a slurry-free inert gas into a polishing slurry comprises injecting a molecular gas containing carbon and oxygen.

17. The method of claim 12, wherein injecting a slurry-free inert gas into a polishing slurry comprises injecting an inert gas through holes in the polishing pad.

18. The method of claim 12, wherein the polishing method comprises a process carried out in the fabrication of a semiconductor device.

19. A method for forming a polishing composition, the method comprising:

providing a polishing liquid on a porous polishing pad and introducing a slurry-free inert gas into the polishing liquid through the porous polishing pad to form a bubble layer at the surface of the polishing liquid; and contacting an uneven surface with the bubble layer, wherein the bubble concentration in the bubble layer varies in relation to features in the uneven surface.

20. The method of claim 19, wherein introducing a slurry-free inert gas comprises introducing a noble gas.

21. The method of claim 19, wherein introducing a slurry-free inert gas comprises introducing a nitrogen gas.

22. The method of claim 19, wherein introducing a slurry-free inert gas comprises introducing a molecular gas containing carbon and oxygen.

23. A polishing process comprising:

providing a substrate having an uneven surface characterized by high regions and low regions with respect to a principal surface;

distributing a polishing slurry onto a porous polishing pad;

contacting the uneven surface with the polishing slurry and polishing the uneven surface; and injecting a slurry-free inert gas through a gas delivery system positioned on a back side of the porous polishing pad and into the polishing slurry distributed on a front side of the porous polishing pad before or during polishing, such that a gaseous phase forms in regions of the polishing slurry in contact with the low regions of the uneven surface, wherein the gaseous phase retards a localized polish rate in the low regions with respect to a localized polish rate in the high regions.

* * * * *